United States Patent
Hamelin

(10) Patent No.: US 8,007,591 B2
(45) Date of Patent: Aug. 30, 2011

(54) SUBSTRATE HOLDER HAVING A FLUID GAP AND METHOD OF FABRICATING THE SUBSTRATE HOLDER

(75) Inventor: Thomas Hamelin, Georgetown, MA (US)

(73) Assignee: Tokyo Electron Limited, Tokyo (JP)

( * ) Notice: Subject to any disclaimer, the term of this patent is extended or adjusted under 35 U.S.C. 154(b) by 685 days.

(21) Appl. No.: 10/587,390

(22) PCT Filed: Dec. 23, 2004

(86) PCT No.: PCT/US2004/039780
§ 371 (c)(1),
(2), (4) Date: Apr. 20, 2007

(87) PCT Pub. No.: WO2005/074450
PCT Pub. Date: Aug. 18, 2005

(65) Prior Publication Data
US 2007/0224777 A1 Sep. 27, 2007

Related U.S. Application Data

(60) Provisional application No. 60/540,519, filed on Jan. 30, 2004.

(51) Int. Cl.
*C23C 16/00* (2006.01)
*C23F 1/00* (2006.01)
*H01L 21/306* (2006.01)

(52) U.S. Cl. ... 118/725; 118/722; 118/728; 156/345.51; 156/345.52; 156/345.53

(58) Field of Classification Search ............... 118/725, 118/278, 729, 730, 731, 732; 156/345.51, 156/345.52, 345.53, 345.54, 345.55
See application file for complete search history.

(56) References Cited

U.S. PATENT DOCUMENTS

| | | | | |
|---|---|---|---|---|
| 3,909,917 A | * | 10/1975 | Lebedev et al. | 228/216 |
| 5,078,851 A | * | 1/1992 | Nishihata et al. | 204/298.34 |
| 5,280,156 A | * | 1/1994 | Niori et al. | 219/385 |
| 5,323,292 A | | 6/1994 | Brzezinski | |
| 5,730,803 A | * | 3/1998 | Steger et al. | 118/723 R |
| 5,775,416 A | * | 7/1998 | Heimanson et al. | 165/275 |

(Continued)

FOREIGN PATENT DOCUMENTS

JP 02-263789 10/1990

(Continued)

OTHER PUBLICATIONS

English Translation of Japanese Office Action issued Mar. 8, 2011, in Patent Application No. 2006-551054.

(Continued)

*Primary Examiner* — Maureen Gramaglia
*Assistant Examiner* — Tiffany Nuckols
(74) *Attorney, Agent, or Firm* — Oblon, Spivak, McClelland, Maier & Neustadt, L.L.P.

(57) ABSTRACT

A substrate holder (20) for supporting a substrate (30). A heating component (50) is positioned adjacent to a supporting surface and between the supporting surface and a cooling component (60). A fluid gap is positioned between the cooling component and the heating component, the fluid gap configured to receive a fluid to increase thermal conduction between the cooling component and the heating component. A brazing material is disposed between the cooling component and the heating component, the brazing material disposed adjacent to the fluid gap.

36 Claims, 1 Drawing Sheet

U.S. PATENT DOCUMENTS

| | | | |
|---|---|---|---|
| 5,810,933 A | 9/1998 | Mountsier et al. | |
| 6,051,074 A * | 4/2000 | Strodtbeck et al. | 118/729 |
| 6,180,926 B1 | 1/2001 | Duddy et al. | |
| 6,190,063 B1 | 2/2001 | Akimoto | |
| 6,508,062 B2 | 1/2003 | Flanigan | |
| 6,646,233 B2 * | 11/2003 | Kanno et al. | 219/390 |
| 6,736,206 B2 * | 5/2004 | Hisai | 165/260 |
| 7,033,444 B1 | 4/2006 | Komino et al. | |
| 2001/0019472 A1 | 9/2001 | Kanno et al. | |
| 2002/0050246 A1 * | 5/2002 | Parkhe | 118/500 |
| 2003/0228772 A1 * | 12/2003 | Cowans | 438/795 |
| 2004/0097088 A1 | 5/2004 | Kitayama et al. | |
| 2004/0123805 A1 | 7/2004 | Tomoyoshi | |
| 2004/0144561 A1 * | 7/2004 | Osanai et al. | 174/252 |

FOREIGN PATENT DOCUMENTS

| | | |
|---|---|---|
| JP | 05-029448 | 2/1993 |
| JP | 09-172057 | 6/1997 |
| JP | 09-232415 | 9/1997 |
| JP | 10-150100 | 6/1998 |
| JP | 10-256359 | 9/1998 |
| JP | 11-110053 | 4/1999 |
| JP | 11-265931 | 9/1999 |
| JP | 2001-068538 | 3/2001 |
| JP | 2001-110883 | 4/2001 |
| JP | 2001-110885 | 4/2001 |
| JP | 2001-347480 | 12/2001 |
| JP | 2002-9064 | 1/2002 |
| JP | 2002-217178 | 8/2002 |
| JP | 58-182818 | 10/2002 |
| JP | 2002-327275 | 11/2002 |
| JP | 2002-343693 | 11/2002 |
| JP | 2003-179040 | 6/2003 |
| JP | 2003-243490 | 8/2003 |
| JP | 2003-282685 | 10/2003 |
| KR | 2001-0110737 | 12/2001 |

OTHER PUBLICATIONS

Japanese Office Action dated Jul. 27, 2010 in JP Appl. No. 2006-528000 (with English Translation).

Japanese Office Action dated Dec. 7, 2010 in JP Appl. No. 2006-528000 (with English Translation).

Korean Office Action dated Oct. 1, 2010 in KR Appl. No. 10-2006-7007931 (with English Translation).

Korean Office Action issued Apr. 27, 2011 in Korean Patent Application No. 10-2006-7009950 (with English translation).

* cited by examiner

SUBSTRATE HOLDER HAVING A FLUID GAP AND METHOD OF FABRICATING THE SUBSTRATE HOLDER

BACKGROUND OF THE INVENTION

1. Field of the Invention

The present invention is generally related to semiconductor processing systems and, more particularly, to a substrate holder having a fluid gap and a method of fabricating the substrate holder.

2. Discussion of the Background

Many processes (e.g., chemical, plasma-induced, etching and deposition) depend significantly on the instantaneous temperature of a substrate (also referred to as a wafer). Thus, the capability to control the temperature of a substrate is an essential characteristic of a semiconductor processing system. Moreover, fast application (in some important cases, periodically) of various processes requiring different conditions within the same vacuum chamber requires the capability of rapid change and control of the substrate temperature. One method of controlling the temperature of the substrate is by heating or cooling a substrate holder (also referred to as a chuck). Methods to accomplish faster heating or cooling of the substrate holder have been proposed and applied before, but none of the existing methods provide rapid enough temperature control to satisfy the growing requirements of the industry.

For example, flowing liquid through channels in the chuck is one method for cooling substrates in existing systems. However, temperature of the liquid is controlled by a chiller, which is usually located at a remote location from the chuck assembly, partially because of its noise and size. The chiller unit is also limited in its capabilities for rapid temperature change due to the significant volume of the cooling liquid and the limitations on heating and cooling power. Moreover, there is an additional time delay for the chuck to reach a desired temperature setting, depending mostly on the size and material of the chuck block. These factors limit how rapidly the substrate can be heated or cooled to a desired temperature.

Other methods have also been proposed and used, including the use of an electric heater embedded in a substrate holder to affect heating of the substrate. The embedded heater increases the temperature of the substrate holder, but the cooling thereof is still dependent on cooling liquid controlled by a chiller. Also, the amount of power that can be applied to the embedded heater is limited, as the chuck materials in direct contact with the embedded heater may be permanently damaged. The temperature uniformity on an upper surface of the substrate holder is also an essential factor and further limits the rate of heating. All of these factors place limits on how rapidly a temperature change of a substrate can be accomplished.

Further, to fabricate the substrate holder, the embedded heater and the cooling fluid channel assembly should be attached to one another such that a connection of satisfactory strength is obtained. However, the method of attachment should not unsatisfactorily interfere with the ability to rapidly change the temperature of the substrate holder.

BRIEF SUMMARY OF THE INVENTION

One object of the present invention is to solve or reduce the above described and/or other problems in the art of substrate processing devices;

Another object of the invention is to provide a substrate holder having a heater and cooling channel assembly attached to one another in a way that provides satisfactory strength, but does not unsatisfactorily interfere with the ability to rapidly change the temperature of the substrate holder.

These and/or other objects of the present invention may be provided by a substrate holder for supporting a substrate that can include a heating component positioned adjacent to a supporting surface and between the supporting surface and a cooling component. A fluid gap can be positioned between the cooling component and the heating component, the fluid gap configured to receive a fluid to control thermal conduction between the cooling component and the heating component. A brazing material can be disposed between the cooling component and the heating component, to join the components, the brazing material disposed adjacent to the fluid gap.

The present invention further provides a substrate holder that can include means for preventing flow of the brazing material into the fluid gap.

In a preferred embodiment of the invention, the means can include a groove.

The present invention further provides a method of manufacturing a substrate holder including a heating component and a cooling component, including providing a fluid gap configured to receive a fluid to control thermal conduction between the heating component and the cooling component, and inserting a brazing material between the heating component and the cooling component adjacent to the fluid gap.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
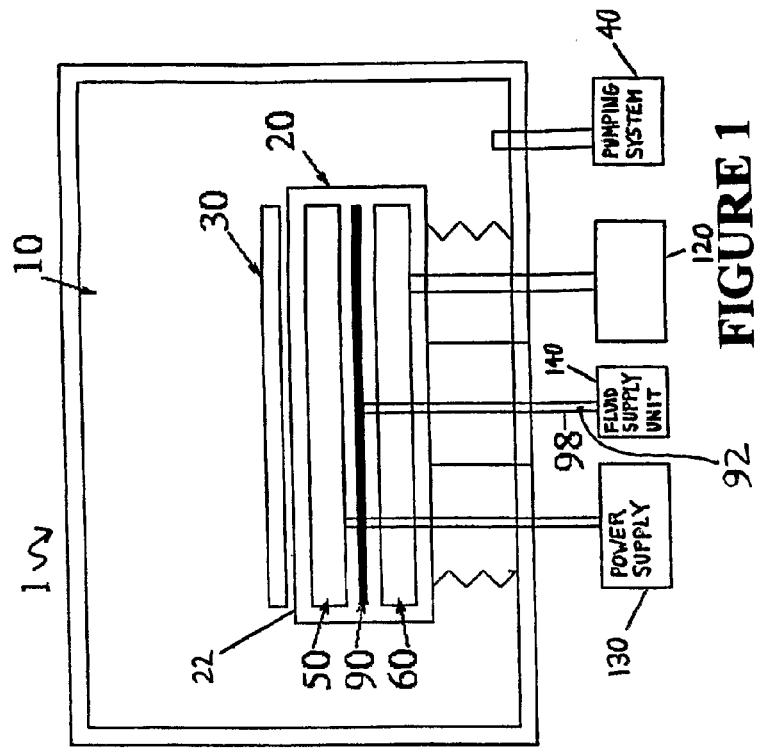
FIG. 1 is a schematic view of a semiconductor processing apparatus in accordance with an exemplary embodiment of the present invention.

Referring now to the drawings, where like reference numeral designations identify the same or corresponding parts throughout the several views, several embodiments of the present invention are next described.

FIG. 1 illustrates a semiconductor processing system 1, which can be used for chemical and/or plasma processing, for example. The processing system 1 includes a vacuum processing chamber 10, a substrate holder 20 having a supporting surface 22, and a substrate 30 that is supported by substrate holder 20. The processing system 1 also includes a pumping system 40 for providing a reduced pressure atmosphere in the processing chamber 10, an embedded electric heating component 50 energized by a power supply 130, and an embedded cooling component 60 with channels for a liquid flow controlled by a cooling channel assembly 120. A fluid gap 90 is provided between the heating component 50 and the cooling component 60. A fluid supply unit 140 is provided to supply and remove a fluid 92 from the fluid gap 90 via the conduit 98 to facilitate heating and cooling of the substrate holder 20. As a non-limiting example, the fluid can be helium (He) gas or, alternatively, any other fluid capable of rapidly and significantly increasing or decreasing the heat conductivity across fluid gap 90.

Figure 2:
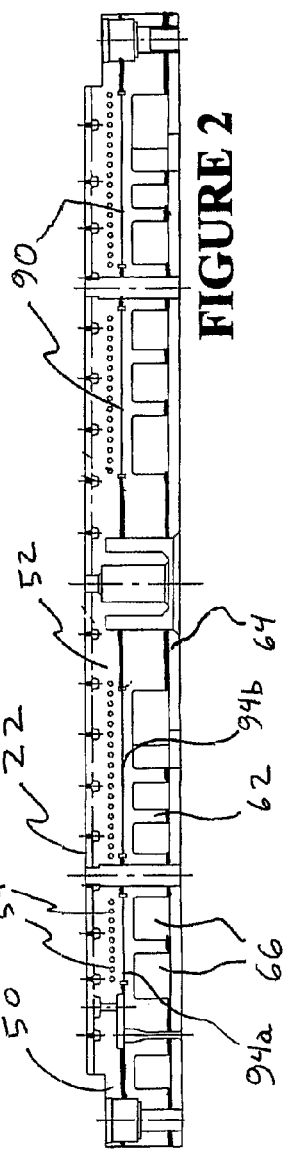
FIG. 2 is a cross-section view of the substrate holder of FIG. 1.
Figure 3:
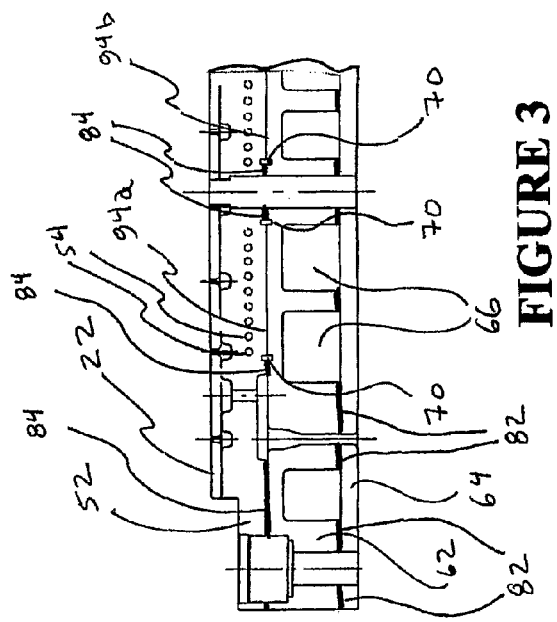
FIG. 3 is a detail view of a portion of the substrate holder of FIG. 2.

FIGS. 2 and 3 show additional details of the substrate holder 20 in relation to the substrate 30. As seen in the figures, the helium backside flow 80 is provided from a He supply (not shown) for enhanced thermal conductivity between the substrate holder 20 and the substrate 30. The enhanced thermal conductivity ensures that rapid temperature control of the supporting surface 22, which is directly adjacent to the heating component 50, leads to rapid temperature control of the substrate 30. Grooves on the surface 22 are used for wafer-backside gas distribution. Typical gases used for backside flow are He and Ar, but others may also be used. The substrate holder 20 can include an electrostatic clamping electrode (not shown) and a corresponding DC power supply and connecting elements required to provide electrostatic clamping of substrate 30 to substrate holder 20.

As shown in FIGS. 2 and 3, the heating component 50 can have a body portion 52 adapted to transfer heat to and from the substrate holder 20 and subsequently the substrate 30 during operation of the heating component 50 and the cooling component 60. The body portion 52 can be manufactured from an aluminum alloy and formed by machining or casting. In a preferred embodiment of the invention, the body portion 52 is made of cast aluminum alloy.

The body portion 52 can include an embedded heater 54. The embedded heater 54 can include one or more heater zones, which can be separately energized to heat sections of the body portion 52, and to transfer heat to the substrate holder 20 and the substrate 30. In a preferred embodiment of the invention, the body portion 52 includes two (2) heater zones that are separately energized and cast into the body portion 52 of the heating component 50, such that the heating component 50 is a unitary part that includes the body portion 52 and the embedded heater 54.

An example of a preferred heating component 50 including the body portion 52 and the embedded heater 54 is a plate heater with Inconel alloy external tubes having a diameter of about 0.4 mm, and a nichrome alloy wire heater insulated from the external tube with magnesium oxide, available from Watlow Electric Manufacturing Co., of St. Louis, Mo.

As shown in FIGS. 2 and 3, the cooling component 60 can include an upper cap 62 and a lower cap 64 adapted to transfer heat from the substrate holder 20 and subsequently the substrate 30 during operation of the cooling component 60.

The upper cap 62 can include a plurality of channels 66 arranged to contain liquid flow controlled by the cooling channel assembly 120, to thereby chill the cooling component 60 and subsequently the substrate holder 20 and substrate 30. The upper cap 62 can be manufactured from an aluminum alloy, and can be formed by machining or casting. In a preferred embodiment of the invention, the upper cap 62 is a cast aluminum alloy, and more preferably is the same cast aluminum alloy as the body portion 52 of the heating component 50.

The lower cap 64 of the cooling component 60 can include a flat surface defining a closed volume with the channels 66 of the upper cap 62 to prevent undesired leakage of the liquid from the cooling component 60. The lower cap 64 can be manufactured from an aluminum alloy, and/or can be formed by casting. Thus, in a preferred embodiment of the invention, the lower cap 64 is a cast aluminum alloy, and more preferably is the same cast aluminum alloy as the upper cap 62 of the cooling component 60, and still more preferably is also the same cast alloy as the body portion 52 of the heating component 50.

Although the figures show certain preferred embodiments of the cooling component 60 including the channels 66 disposed entirely in the upper cap 62, it is to be understood that the channels 66 can be disposed in either or both of the upper cap 62 and the bottom cap 64.

As shown in FIGS. 2 and 3, the fluid gap 90 can be provided between an upper internal surface of the cooling section 60 and a lower internal surface of the heating section 50, such that the heat conductance across the fluid gap 90 is minimized, while keeping the surfaces very close (i.e., within a range of a few microns; preferably, approximately 50 microns) to each other. With this configuration, the thermal conductance across fluid gap 90 can be varied by two orders of magnitude or more, in a controllable fashion, by the introduction and evacuation of fluid 92.

Details of the fluid gap 90 are discussed in Applicants' co-pending application Ser. No. 10/670,292, the disclosure of which is incorporated by reference herein in its entirety. As discussed in the co-pending application, the fluid gap 90 can define a single-zone system, and as shown in the figures can define a dual-zone system in which a first zone 94a includes and is formed by inner grooves and inner ports (not shown), and a second zone 94b includes and is formed by outer grooves and outer ports (not shown). In the dual-zone system, the inner grooves govern pressure, thermal conductance, and/or temperature in the first zone 94b of the substrate holder 20, while the outer grooves govern these conditions in the second zone 94a of the substrate holder 20. Any of the grooves in either the single- or dual-zone systems can be disposed in entirely or partially in the heating component 50 and the cooling component 60, and more particularly in the body portion 52 of the heating component 50 and the upper cap 62 of the cooling component 60.

Details of connections among components of the substrate holder 20 are discussed below.

It is to be understood that the system shown in FIGS. 1 to 3 is exemplary only and that other elements may be included. For example, the processing system 1 can also include a RF power supply and an RF power feed, pins for placing and removing the wafer, a thermal sensor, and any other elements known in the art. The processing system 1 can also include process gas lines entering the vacuum chamber 10, and a second electrode (for a capacitively-coupled-type system) or an RF coil (for an inductively-coupled-type system), for exciting the gas in the vacuum chamber 10 into a plasma. The invention is also applicable to non-plasma processing, such as rapid thermal processing of wafers.

The various embodiments of the present invention can be operated as follows. During a heating phase, the heating component 50 is powered, while the fluid 92 is evacuated from the fluid gap 90 to a low pressure, in the neighborhood of 10 Torr. In this way, the heat conductance across the fluid gap 90 is greatly decreased such that the fluid gap 90 acts as a heat barrier. That is, the evacuation step effectively separates the portion of the substrate holder 20 directly surrounding the cooling component 60 from the portion of the substrate holder 20 directly surrounding the heating component 50. Thus, the mass of the substrate holder 20 to be heated by the heating component 50 is effectively reduced to only the portion of the substrate holder 20 directly over and surrounding the heating component 50, allowing rapid heating of the supporting surface 22 and the wafer 30. Alternative to the use of the heating component 50, heating can be provided by an external heat flux, such as heat flux from the plasma generated in the vacuum chamber 10.

In the cooling phase, the heating component 50 is turned off, the fluid 92 is supplied to the fluid gap 90 from the fluid supply unit 140, and the cooling component 60 is activated. When the fluid gap 90 is filled with the fluid 92 at a higher pressure, for example atmospheric pressure (760 Torr), the heat conductance across the fluid gap 90 is significantly increased, thus providing rapid cooling of the supporting surface 22 and the wafer 30 by the cooling component 60. Contact between the body portion 52 of the heating component 50 and the upper cap 62 of the cooling component 60 prevents the fluid 92 from flowing out of the fluid gap 90.

The various embodiments of the invention can be assembled, fabricated, or otherwise formed as follows. As stated above, the channels 66 can be formed in either or both of the upper cap 62 and lower cap 64 of the cooling component 60. The upper cap 62 and the lower cap 64 of the cooling component 60 can be connected with one another, to thereby close the channels 66. The upper cap 62 and the lower cap 64 formed of suitable materials can be brazed to one another by insertion of a brazing material 82, which can be in the form of a sheet, between surfaces of the upper cap 62 and the lower cap 64, and by heating of the cooling component 60 to a temperature above a melting point of the brazing material 82 and below a melting point of one or both of the upper cap 62 and lower cap 64. Thus, in a preferred embodiment of the invention, which includes the upper cap 62 and the lower cap 64 formed of the same cast aluminum alloy, the upper cap 62 can be brazed to the lower cap 64 to form the cooling component 60.

The body portion 52 of the heating component 50 can be cast with the embedded heater 54, to thereby form the heating component 50.

The heating component 50 and the cooling component 60, and more particularly the body portion 52 of the heating component 50 and the upper cap 62 of the cooling component 60, can be connected with one another. As described in the Background of the Invention section above, the heating component 50 and cooling component 60 should be attached to one another such that a connection of satisfactory strength and thermal conductance is obtained. According to an embodiment of the invention, the body portion 52 of the heating component 50 and the upper cap 62 of the cooling component 60 formed of suitable materials can be brazed to one another by insertion of a brazing material 84, which can be in the form of a sheet, between surfaces of the heating component 50 and the cooling component 60. The heating component 50 and the cooling component 60 can be heated above a melting point of the brazing material 84 and below a melting point of one or both of the heating component 50 and the cooling component 60. Thus, in a preferred embodiment of the invention, which includes the body portion 52 and the upper cap 62 formed of the same cast aluminum alloy, the body portion 52 can be brazed to the upper cap 62 to connect the heating component 50 and the cooling component 60, to thereby form at least a portion of the substrate 20.

The present inventors have recognized, however, that brazing of the heating component 50 and the cooling component 60 could result in the brazing material 84 flowing into the fluid gap 90 between the body portion 52 and the upper cap 62, thereby obviating the advantages provided by the fluid gap 90 configured to be filled with and evacuated of the fluid 92. To reduce or prevent the undesired flow of the brazing material 84 into the fluid gap 90, the body portion 52 and/or the upper cap 62 can be provided with grooves 70. The grooves 70 can be sized, shaped, and/or oriented such that flow of the brazing material 84 across the grooves is prevented. The grooves 70 can be in the form of concentric circles, and can be formed in either or both of the heating component 50 and the cooling component 60 (i.e., the body portion 52 and/or the upper cap 62). Multiple parallel and/or concentric grooves 70 may also be used.

The supporting surface 22 can be connected with the body portion 50. In a preferred embodiment of the invention, the supporting surface 22 can be mechanically connected to the body portion 52 by way of an adhesive, such as a silicone-based adhesive. The adhesive has to allow differential thermal expansion of the bonded parts.

The substrate holder 20 can be treated, such as by annealing, hard anodizing, alumina or yttria ceramic spray-coating, etc., after brazing, to provide a desired mechanical properties, hardness, plasma-resistance, or other desired properties to the heating component 50 and the cooling component 60, including properties compromised during the brazing of one or more of the components of the substrate holder 20 (e.g. anneal to relieve residual stresses).

The present invention can be effectively applied in various systems where efficient temperature control or rapid temperature control is of importance. Such systems include, but are not limited to, systems using plasma processing, non-plasma processing, chemical processing, etching, deposition, film-forming, or ashing. The present invention can also be applied to a plasma processing apparatus for a target object other than a semiconductor wafer, e.g., an LCD glass substrate, or similar device. Furthermore, it is understood that the present invention can be practiced in a number of alternative embodiments wherein the heating component 50 includes one or more thermoelectric (Peltier) devices, or one or more channels similar to cooling channel 60, through which fluorinated dielectric liquid, water, or steam, are flowed at an elevated temperature. Also, the cooling component 60 can include one or more thermoelectric (Peltier) devices.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A substrate holder for supporting a substrate, comprising:
    a supporting surface;
    a cooling component having a plurality of cooling channels configured to receive a cooling fluid;
    a heating component positioned adjacent to the supporting surface and between the supporting surface and the cooling component;
    a fluid gap positioned between the cooling component and the heating component such that the fluid gap is interposed between the plurality of cooling channels of the cooling component and heating component, the fluid gap configured to receive a fluid to vary the thermal conductance between the cooling component and the heating component;
    a brazing material disposed at least along a peripheral region between the cooling component and the heating component such that the brazing material is disposed adjacent to the fluid gap and in direct contact with each of the heating component and cooling component and seals an enclosure which forms the fluid gap; and
    wherein the fluid gap comprises a least one groove configured to prevent flow of the brazing material into the fluid gap.

2. The substrate holder according to claim 1, wherein the heating component comprises a body portion and an embedded heater disposed in the body portion.

3. The substrate holder according to claim 2, wherein the body portion comprises an aluminum alloy, and the embedded heater is cast in the aluminum alloy.

4. The substrate holder according to claim 1, wherein the cooling component comprises an upper cap and a lower cap.

5. The substrate holder according to claim 4, wherein the upper cap comprises the plurality of channels configured to receive a cooling fluid.

6. The substrate holder according to claim 5, wherein the lower cap comprises a plate having a flat top surface positioned adjacent to the upper cap.

7. The substrate holder according to claim 6, further comprising:
a second brazing material positioned between the upper cap and the lower cap.

8. The substrate holder according to claim 1, further comprising:
a mechanical connection positioned between the supporting surface and the heating component.

9. The substrate holder according to claim 8, wherein the mechanical connection comprises an adhesive.

10. The substrate holder according to claim 1, wherein the at least one groove fluid gap comprises at least one fluid gap groove in at least one of the heating component and the cooling component.

11. The substrate holder according to claim 10, wherein the fluid gap groove is disposed in the cooling component.

12. The substrate holder according to claim 10, wherein the fluid gap groove is disposed in the heating component.

13. The substrate holder according to claim 1, wherein the at least one groove comprises an isolating groove positioned between the cooling component and the heating component, the isolating groove configured to prevent flow of the brazing material into the fluid gap.

14. The substrate holder according to claim 13, wherein at least a portion of the isolating groove is disposed in the cooling component.

15. The substrate holder according to claim 13, wherein at least a portion of the isolating groove is disposed in the heating component.

16. The substrate holder according to claim 15, wherein at least a portion of the isolating groove is disposed in the cooling component.

17. The substrate holder according to claim 13, wherein at least one isolating groove comprises a plurality of isolating grooves.

18. The substrate holder according to claim 17, wherein the plurality of isolating grooves are concentric.

19. The substrate holder according to claim 18, wherein the isolating grooves are disposed in at least one of the heating component and the cooling component.

20. The substrate holder according to claim 1, wherein the at least one groove comprises first and second isolating grooves further comprising:
first and second isolating groove positioned between the heating component and the cooling component and on opposite sides of the fluid gap, the isolating grooves configured to prevent flow of the brazing material into the fluid gap.

21. The substrate holder according to claim 20, wherein the heating component and the cooling component comprise aluminum alloys.

22. The substrate holder according to claim 21, wherein the heating component comprises a body portion and an embedded heater, the embedded heater cast into the body portion.

23. The substrate holder according to claim 20, wherein the heating component and the cooling component comprise a same aluminum alloy.

24. The substrate holder according to claim 23, wherein the cooling component comprises an upper cap and a lower cap, the heating component positioned between the supporting surface and the upper cap.

25. The substrate holder according to claim 24, wherein the upper cap comprises a same aluminum alloy as the heating component.

26. The substrate holder according to claim 1, wherein the brazing material further comprises a brazing material provided radially inward of the peripheral region so as to form a plurality of discrete fluid gaps between the cooling component and heating component.

27. The substrate holder according to claim 1, wherein the fluid gap is approximately 50 μm in distance.

28. The substrate holder according to claim 1, wherein said brazing material is in the form of a sheet between surfaces of the heating component and cooling component.

29. A substrate holder for supporting a substrate, comprising:
a supporting surface;
a cooling component having a plurality of cooling channels configured to receive a cooling fluid;
a heating component positioned adjacent to the supporting surface and between the supporting surface and the cooling component;
a fluid gap positioned between the cooling component and the heating component such that the fluid gap is interposed between the plurality of cooling channels of the cooling component and heating component, the fluid gap configured to receive a fluid to vary the thermal conductance between the cooling component and the heating component;
a brazing material disposed at least along a peripheral region between the cooling component and the heating component such that the brazing material is disposed adjacent to the fluid gap and in direct contact with each of the heating component and cooling component and seals an enclosure which forms the fluid gap; and a groove means for preventing flow of the brazing material into the fluid gap.

30. The substrate holder according to claim 26, wherein the groove means comprises a groove is disposed in at least one of the heating component and the cooling component.

31. The substrate holder according to claim 30, wherein at least a portion of the groove is disposed in the cooling component.

32. The substrate holder according to claim 30, wherein at least a portion of the groove is disposed in the heating component.

33. The substrate holder according to claim 32, wherein at least a portion of the groove is disposed in the cooling component.

34. A substrate holder for supporting a substrate, comprising:
a supporting surface;
means for cooling the supporting surface;
means for heating the supporting surface positioned adjacent to the supporting surface and between the supporting surface and the means for cooling;
means for receiving a fluid to vary thermal conductance between the means for cooling and the means for heating, the means for receiving a fluid being positioned between the means for cooling and the means for heating;

a brazing material disposed at least along a peripheral region between the means for cooling and the means for heating such that the brazing material is in direct contact with each of the means for heating and means for cooling and seals an enclosure which forms the means for receiving a fluid; and a groove in at least one of the means for heating and the means for cooling, the groove being configured to prevent flow of the brazing material into the means for receiving a fluid.

35. The substrate holder according to claim 34, wherein the means for heating comprises at least one of a thermoelectric device and a channel configured to flow at least one of elevated temperature fluorinated dielectric liquid, water, and steam.

36. The substrate holder according to claim 34, wherein the means for cooling comprises at least one thermoelectric device.

* * * * *